(12) United States Patent
Coffin et al.

(10) Patent No.: US 7,353,488 B1
(45) Date of Patent: Apr. 1, 2008

(54) FLOW DEFINITION LANGUAGE FOR DESIGNING INTEGRATED CIRCUIT IMPLEMENTATION FLOWS

(75) Inventors: Mike Coffin, San Jose, CA (US); Peter Dahl, Sunnyvale, CA (US); Cheng-yeh Yen, Redwood City, CA (US)

(73) Assignee: Magma Design Automation, Inc., San Jose, CA (US)

( * ) Notice: Subject to any disclaimer, the term of this patent is extended or adjusted under 35 U.S.C. 154(b) by 413 days.

(21) Appl. No.: 10/856,268

(22) Filed: May 27, 2004

(51) Int. Cl.
*G06F 17/50* (2006.01)
*G06F 17/00* (2006.01)
*G06F 3/00* (2006.01)
*G06F 9/44* (2006.01)

(52) U.S. Cl. .................. 716/18; 707/100; 717/132; 715/700

(58) Field of Classification Search ............ 717/155, 717/132; 716/1, 3, 18; 715/700; 707/100
See application file for complete search history.

(56) References Cited

U.S. PATENT DOCUMENTS

| | | | |
|---|---|---|---|
| 5,309,371 A | | 5/1994 | Shikata et al. |
| 5,530,870 A | * | 6/1996 | De Bruler ................. 717/155 |
| 5,966,534 A | * | 10/1999 | Cooke et al. ............ 717/155 |
| 6,035,123 A | * | 3/2000 | Razdan et al. ............ 717/155 |
| 6,077,313 A | * | 6/2000 | Ruf ........................ 717/155 |
| 6,080,204 A | | 6/2000 | Mendel |
| 6,111,310 A | | 8/2000 | Schultz |
| 6,167,561 A | | 12/2000 | Chen et al. |
| 6,306,745 B1 | | 10/2001 | Chen |
| 6,378,066 B1 | * | 4/2002 | Lewis ..................... 712/236 |
| 6,408,427 B1 | | 6/2002 | Cong et al. |
| 6,449,711 B1 | * | 9/2002 | Week ...................... 712/223 |
| 6,467,074 B1 | | 10/2002 | Katsioulas et al. |
| 6,519,749 B1 | | 2/2003 | Chao et al. |
| 6,671,869 B2 | | 12/2003 | Davidson et al. |
| 6,701,509 B2 | | 3/2004 | Aggarwal et al. |
| 6,772,401 B2 | | 8/2004 | Li |
| 6,857,116 B1 | | 2/2005 | Dahl et al. |
| 6,876,960 B1 | | 4/2005 | Naylor et al. |
| 6,952,817 B1 | * | 10/2005 | Harris et al. ................ 716/18 |
| 7,020,594 B1 | | 3/2006 | Chacon |
| 7,020,852 B2 | | 3/2006 | Oeltjen et al. |
| 7,131,094 B2 | | 10/2006 | Kolk et al. |
| 7,155,708 B2 | * | 12/2006 | Hammes et al. ............ 717/155 |
| 7,168,041 B1 | | 1/2007 | Durrill et al. |
| 7,174,536 B1 | * | 2/2007 | Kothari et al. ............ 717/109 |
| 2002/0144247 A1 | * | 10/2002 | Tirumalai et al. .......... 717/155 |
| 2003/0074652 A1 | * | 4/2003 | Harrison et al. ........... 717/151 |
| 2003/0237078 A1 | * | 12/2003 | Williams et al. ........... 717/155 |
| 2004/0088689 A1 | * | 5/2004 | Hammes ..................... 717/154 |
| 2005/0097488 A1 | | 5/2005 | Lakshmanan et al. |

* cited by examiner

*Primary Examiner*—Stacy Whitmore
(74) *Attorney, Agent, or Firm*—Townsend & Townsend & Crew LLP

(57) ABSTRACT

An instance of a flow definition language for designing an integrated circuit implementation flow. The instance of the flow definition language includes a hierarchical collection of stages for a physical chip design. Relational constraints define the execution order of a plurality of tasks in the hierarchical collection of stages. Parameters customize the plurality of tasks. The relational constraints and parameters are hierarchically defined, such that higher order definitions in the hierarchical collection of stages override lower level definitions of the relational constraints and parameterized knobs.

24 Claims, 11 Drawing Sheets

600A

600B

600C

600D

FLOW DEFINITION LANGUAGE FOR DESIGNING INTEGRATED CIRCUIT IMPLEMENTATION FLOWS

CROSS REFERENCE TO RELATED APPLICATION

This application is related to U.S. patent application, Ser. No. 10/856,301 by Cheng-yeh Yen, Peter Dahl, and Mike Coffin, filed on May 27, 2004, entitled "Graphical User Interface to Manage Flows of a Physical Design," and assigned to the assignee of the present invention. To the extent not repeated herein, the contents of this related patent application are hereby incorporated herein by reference.

This application is related to U.S. patent application, Ser. No. 10/856,331 by Mike Coffin, Peter Dahl, and Cheng-yeh Yen, filed on May 27, 2004, entitled "A Method And System For Physical Design Synthesis Using A Distributed Computer System," and assigned to the assignee of the present invention. To the extent not repeated herein, the contents of this related patent application are hereby incorporated herein by reference.

BACKGROUND OF THE INVENTION

1. Field of the Invention

The present invention relates to the field electronic design automation (EDA). More specifically, embodiments of the present invention relate to a flow definition language for designing integrated circuit flows.

2. Related Art

An electronic design automation (EDA) system is a computer system used for designing integrated circuit (IC) devices. The rapid growth of the complexity of modern electronic circuits has forced electronic circuit designers to rely upon computer programs to assist or automate most steps of this design process. Typical circuits today contain hundreds of thousands or millions of individual pieces or "cells." Such a design is too large for a circuit designer or even an engineering team of designers to manage effectively without computer systems.

In general, the EDA system typically receives one or more high level behavioral descriptions of an IC device (e.g., in HDL languages like VHDL, Verilog, etc.) and translates this high level design language description into netlists of various levels of abstraction. At a higher level of abstraction, a generic netlist is typically produced based on technology independent primitives. A netlist is a logical description of the electronic circuit which specifies what cells compose the circuit and which pins of which cells are to be connected together using wires ("nets").

The netlist does not specify where on a circuit board or silicon chip the cells are placed or where the wires run which connect them together. In general, a netlist describes the logical IC design and is composed of nodes (elements) and edges, e.g., connections between nodes, and can be represented using a directed cyclic graph structure having nodes which are connected to each other with signal lines. Further processing is needed to generate a geometric database needed for fabrication of the IC design.

Once the logical design or netlist is generated, given a set of design requirements (e.g., die size, timing, etc.) a large number of "tasks" in design tools are performed to complete the physical layout of each of the blocks in an IC design. Each task is a discrete unit of work. For instance, a placement and route processes can be performed. The placement process finds approximate cell locations which optimize desired metrics and spread cells evenly across the silicon chip or circuit board. In this case, the tasks generate geometric information that determine the actual physical size, dimensions, geometry and placement of cells within blocks of the IC design. Also, a routing process is performed for routing wires within the blocks of the IC design. In this case, the tasks generate wire geometry for routing the wires. The wire geometry data structure and cell placement together are used to make the final geometric database needed for fabrication of the circuit.

In executing the above tasks needed to generate the physical design layout of the IC design, many low level commands with associated parameters, options, variables and target databases are required. In some instances, up one-thousand of these commands may be required to place one block in an IC design. Moreover, separate sets of commands are required for each block that is to be processed. As a result, multiple sets of commands are required for each physical design process, which are repeated over each block. In short, the actual command set required by the designer to place and route a netlist may require tens of thousands of low level commands or tasks which need to be executed by the physical design tools in a particular order.

In an effort to address the daunting task of managing these commands, chip designers have written small "build" programs that function to access a block of the netlist and depending on which block is obtained, apply a predetermined set of commands to the block involving the physical design tools. This set of commands is applied to each block of an IC design. However, the computer time required to perform a place and route on a typical IC design is very long. Should there be a problem with the execute program, the placement or routing of the netlist, or in one of the commands, the entire execute program needs to be re-run from scratch once the problem is isolated and fixed. Therefore, this prior art approach is not very efficient in the face of design errors or program bugs which are always present. Furthermore, although this prior art approach helps to automate some of the designer's job, it still requires that in the development or modification of the execute program, the designer needs to use and edit the low level, voluminous detailed commands. As such, this development process can be tedious, error-prone and time consuming.

Another prior approach to solving the problem of dealing with these low level commands is utilize a program such as UNIX Make, which is well known and commercially available. The program, Make, allows dependency graphs to be used indicating the input and the output of certain nodes, with each node representing a design tool task to be performed. Although offering efficient executions, this prior approach requires that the entire physical design process be hand-coded at each of the low level commands required of the design tools. For instance, to run the same design tool over various blocks requires that the same code be block copied for each block, e.g., using an editor. To change a variable or parameter within the design tools requires that the code portion relating to that design tools be identified and manually modified. As such, the Make program does not offer any flexibility in dealing with similar blocks or in adding or deleting or modifying commands because any such activity must be performed by hand, with an editor, directly on the low level commands. This approach is very tedious, error-prone and time consuming.

Moreover, the Make program is well suited for dependency graphs arranged in horizontal fashion (2 to 3 tasks deep, and many dependency graphs in parallel). However, task sequences can be more vertical with many tasks to be performed in sequential order for far fewer dependency graphs. In this case, errors introduced up front in the order are propagated throughout the dependency graph. Again, this approach is very tedious, error-prone and time consuming.

As a result, traditional techniques for controlling the execution of tasks needed to complete a physical design are tedious, error-prone, and time consuming in that commands are created at the lowest levels no matter the dependency or redundancy of levels.

SUMMARY OF THE INVENTION

Accordingly, various embodiments of the present invention disclose an instance of a flow definition language for designing an associated integrated circuit implementation flow. As a result, the instance of the flow definition language of the present invention is able to complete a physical design of an implementation flow that does not exist solely at the lower levels of implementation. That is, the instance of the flow definition language is able to specify the contents of the low level tasks and the ordering between tasks in an implementation flow at higher levels in the hierarchical collection of stages that comprise an implementation flow. As such, the process to generate a physical design of an implementation flow is less tedious, less susceptible to error, and more time efficient over prior art solutions.

Specifically, in one embodiment, an instance of a flow definition language for designing an integrated circuit implementation flow is described. The instance of the flow definition language includes a hierarchical collection of stages for a physical chip design. Relational constraints define the execution order of a plurality of tasks in the hierarchical collection of stages. Parameters customize the plurality of tasks. The relational constraints and parameters are hierarchically defined, such that higher order definitions in the hierarchical collection of stages override lower level definitions of the relational constraints and parameterized knobs.

In another embodiment, an instance of a hierarchical flow definition language for designing integrated circuit implementation flows is also described. The instance of the hierarchical flow definition language includes a plurality of command file templates, each of which define a task. These tasks are actions from physical design point tools. Each of the command file templates is customized through one or more parameterized knobs.

The instance of the hierarchical flow definition language also includes a plurality of stage definition files, each of which is comprised of at least one of the plurality of tasks. Each of the plurality of stage definition files define relational constraints of the execution order of tasks in and between stages of the integrated circuit implementation flow. Also, each of the stage definition files define values for the parameterized knobs that are used within that stage.

In addition, the instance of the hierarchical flow definition language includes a plurality of subflow definition files, each of which is comprised of at least one of the plurality of stage definition files. Each of the plurality of subflow definition files define relational constraints of tasks in and between stages and subflows in the integrated circuit implementation flow. Also, each of the subflow definition files can define values for the parameterized knobs that are used within that subflow. As a result, the relational constraints and parameterized knobs are hierarchically defined, such that higher order definitions in the hierarchical collection of stages override lower level definitions of the relational constraints and parameterized knobs.

In still another embodiment, a method for designing an instance of a hierarchical flow definition language is disclosed. The method includes establishing a plurality of task templates. Each of the task templates is customizable through one or more parameterized knobs for executing an operation in a physical design point tool. The plurality of task templates is used in a hierarchical collection of stages for a physical chip design. The method also includes establishing relational constraints that define an execution order of the plurality of task templates in and between stages in the hierarchical collection of stages. The hierarchical collection of stages comprises a flow configuration at the highest level. The instance of the flow definition language comprises a plurality of subflows at the next highest level. Each of the plurality of subflows comprises at least one of the plurality of stages at the next level. Each of the plurality of stages comprises at least one of the plurality of task templates. In the hierarchical collection of stages, relational constraints and parameterized knobs are hierarchically defined, such that higher order definitions in the hierarchical collection of stages override lower level definitions of the relational constraints and parameterized knobs.

DETAILED DESCRIPTION OF THE INVENTION

Reference will now be made in detail to the preferred embodiments of the present invention, a flow definition language for designing integrated circuit implementation flows, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Accordingly, various embodiments of the present invention disclose a flow definition language for designing integrated circuit implementation flows. As a result, the flow definition language of the present invention is able to complete a physical design of an implementation flow that allows manipulation at higher levels of a hierarchical collection of stages. That is the flow definition language is able to specify the contents of the low level tasks and the ordering between tasks in an implementation flow at higher levels in the hierarchical collection of stages that comprise an implementation flow. As such, the process to generate a physical design of an implementation flow is less tedious, less susceptible to error, and more time efficient.

Figure 1:
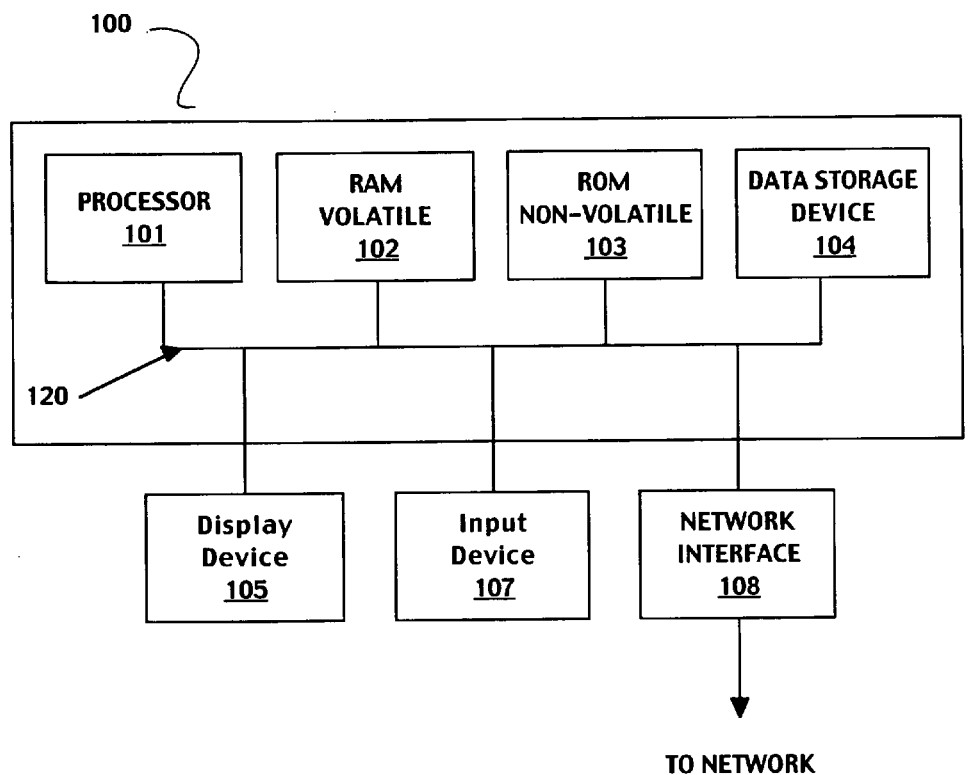
FIG. 1 is a block diagram of a general purpose computer system that can be used as a platform to implement an instance of a flow definition language for designing integrated circuit implementation flows, in accordance with one embodiment of the present invention.

With reference to the method and systems described herein, several aspects are described in terms of steps executed on a computer system or CAD system. Although a variety of different computer systems can be used with the present invention, an exemplary computer system 100 is shown in FIG. 1. In general, computer system 100 that can be used by the present invention includes an address/data bus 120 for communicating information, a central processor 101 coupled with the bus for processing information and instructions, a volatile memory 102 (e.g., random access memory) coupled with the bus 100 for storing information and instructions for the central processor 101 and a non-volatile memory 103 (e.g., read only memory) coupled with the bus 100 for storing static information and instructions for the processor 101. System 100 also contains a data storage device 104 such as a magnetic or optical disk and disk drive coupled with the bus 120 for storing information and instructions, a display device 105 coupled to the bus 120 for displaying information to the computer user, an optional input device 107, such as alphanumeric, function keys, or a cursor control device coupled to the bus 120 for communicating information and command selections to the central processor 101, and a signal generating device 108 coupled to the bus 100 for interfacing with other networked computer systems.

Figure 2:
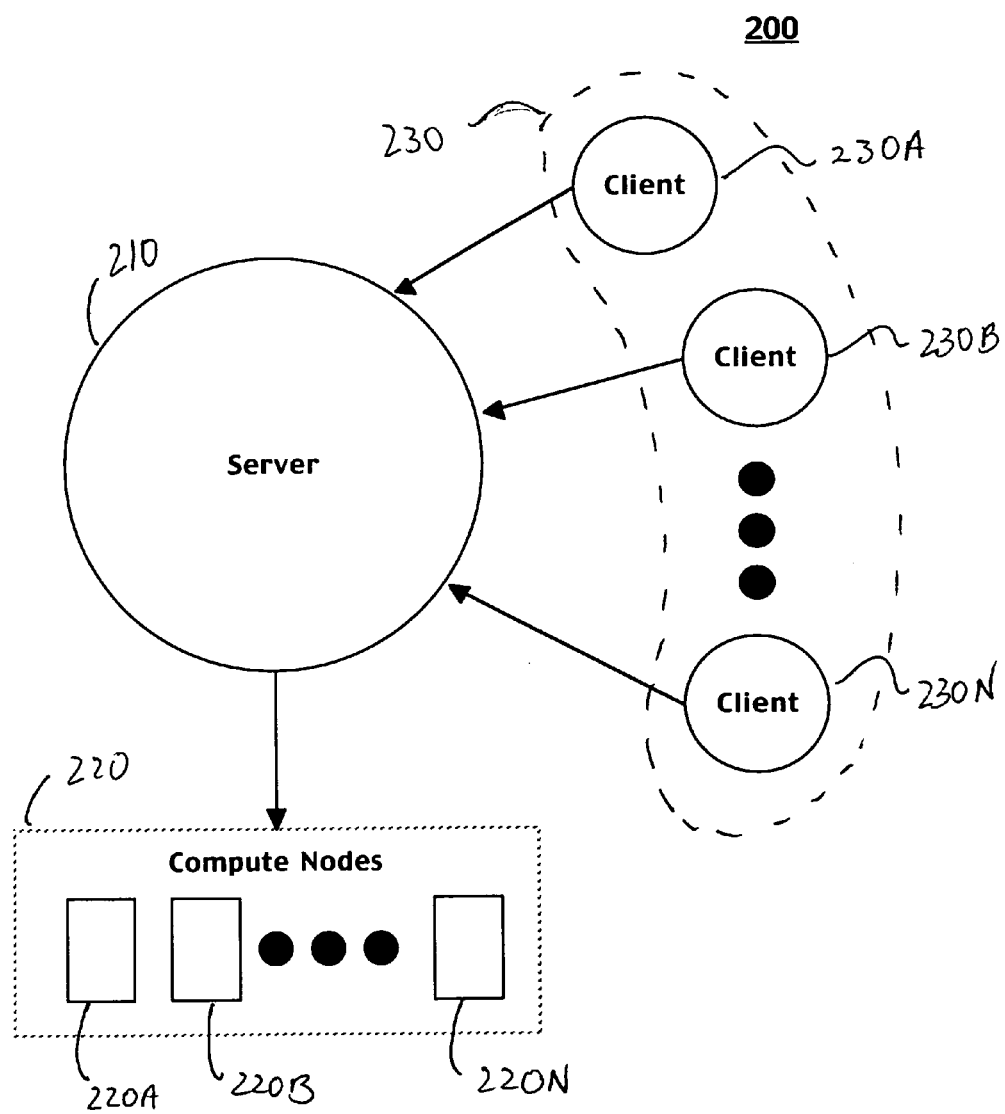
FIG. 2 is a diagram of a client server model that is instructed using an instance of a flow definition language for designing integrated circuit implementation flows, in accordance with one embodiment of the present invention.

Referring now to FIG. 2, a block diagram of a implementation flow builder 200 is shown implementing a flow definition language used for designing integrated circuit implementation flows, in accordance with one embodiment of the present invention. The flow implementation builder 200 may be designed using a client server model. In this example, the flow implementation builder 200 comprises a server 210, a plurality of clients 230, and a "farm" 220 of compute nodes.

The server 210 is responsible for compiling a configuration, or implementation flow, that is used to build a physical layout of the integrated circuit (IC) chip. The server 210 compiles the implementation flow using an instance of the flow definition language of embodiments of the present invention, as follows: 1) by enforcing relational constraints that define execution ordering between stages in the implementation flow; 2) by filling in templates with values for parameterized knobs that are used to customize tasks, stages, and higher levels in the collection of stages of the implementation flow; and 3) for executing the code to perform the tasks of a point tool in the order dictated in an associated stage.

The server 210 controls the execution of the tasks as directed by the instance of the flow definition language to generate an implementation flow. That is, the server 210 compiles the implementation flow using the instance of the flow definition language, and thus understands when to execute and what tasks to execute. However, the server 210 can delegate authority to execute tasks to the plurality of clients 230 or to the farm 220 of compute nodes. For instance, the server 210 can delegate authority for compute nodes 220A, or 220B, on up to 220N to execute tasks for efficiency.

In one embodiment, the server 210 can invoke a task execution in a menu that is sent to the client. This allows tasks to be executed in the environment of the client, which is sometimes quite different from that of the server 210, e.g., the client is executing on a different kind of computer in a different part of the world.

In addition, the server 210 is able to manage requests from the clients in executing the instance of the flow definition language in building the implementation flow. That is, if two clients request the same task, the server only performs the task once. This is different from conventional techniques in which multiple user requests result in the same programs being executed multiple times, which may cause malfunctions.

The plurality of clients 230 is comprised of an arbitrary number of clients, such as clients 230A, 230B, on up to 230N. Each of the plurality of clients can be physically located remotely from each other. Under the current client server model, each of the plurality of clients 230 contribute to the building of the implementation flow through the server 210 following the instance of the flow definition language.

Also, each of the plurality of clients 230 is responsible for presenting status information regarding the building of the implementation flow. In one embodiment, all the clients display the same status. The client server model provides for increased cooperation between users since each client is able to view the status for the entire implementation flow.

In addition, each of the clients provide an interface for accepting requests for task execution, task interruption, etc. in building the implementation flow through the instance of the flow definition language. The server 210 is able to manage the requests in building the implementation flow. For instance, if two clients request the same task, the server 210 only performs the task once. This differs from conventional building of implementation flows. For instance, the client can communicate through a command line format or a graphical user interface (GUI) format with the server 210 using a flow definition language, in embodiments of the present invention.

In one embodiment, the server 210 and clients in the plurality of clients 230 communicate using an extensible markup language (XML) based communication language over the standard transmission communication protocol (TCP). The communication language defines the format for the instance of flow definition language of embodiments of the present invention. As shown in FIG. 2, the server 210 and client are executed on separate machines. However, embodiments of the present invention are well suited to implementations in which the server 210 and client are co-located.

In one embodiment, each of the plurality of clients 230 is able to present information (e.g., to a user), using a collection of GUI elements, such as menus, buttons, forms, etc. The description of the GUI elements as well as their operation can be specified by the server 210 in implementing the instance of the flow definition language.

Physical design of an IC chip generally begins with a logical design (netlist). The netlist is a logical description of the electronic circuit which specifies what cells compose the circuit and which pins of which cells are to be connected together using wires ("nets"). Given a set of requirements, a large number of tasks are performed to complete the physical layout of the IC chip. In embodiments of the present invention, the instance of flow definition language is used to generate an implementation flow that controls the execution of the tasks needed to complete a physical design of the IC chip. The instance flow definition language is used to specify the contents of the tasks and the ordering of tasks in the implementation flow.

Figure 3A:
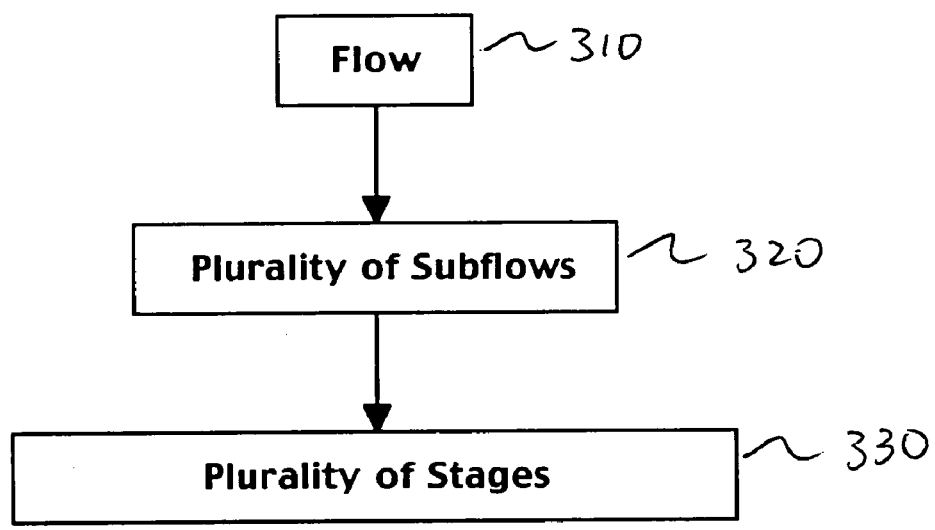
FIG. 3A is a diagram illustrating the hierarchy in a collection of stages used in an instance of a flow definition language for designing integrated circuit implementation flows, in accordance with one embodiment of the present invention.

FIG. 3A is a diagram of a hierarchy 300A in a collection of stages used in an instance of a flow definition language for designing integrated circuit implementation flows, in accordance with one embodiment of the present invention. The collection of stages is comprised of various hierarchical levels, including a flow level 310 at the top of the hierarchy 300A, a plurality of subflow levels 320 below the flow level, and a plurality of stages 330 below the subflow levels.

The diagram defines a hierarchy 300A by which to apply parameters to a collection of stages in an instance of the flow definition language of the present embodiment. The parameters include relational constraints that define the execution order of tasks in the hierarchical collection of stages, and parameterized knobs. Depending on which level in the hierarchy 300A these relational constraints and parameterized knobs are defined determines which relational constraints and values for parameterized knobs are applied to the hierarchical collection of stages. That is, relational constraints used both within a stage, between stages of a subflow, and between stages between subflows, as well as parameterized knobs are hierarchically defined, such that higher order definitions override lower level definitions of the relational constraints and parameterized knobs in the hierarchy 300A.

In general, the instance of the flow definition language that is implemented to generate an implementation flow is hierarchical. That is, stages are combined to form subflows, and subflows are combined to form a flow. As will be explained more fully below, each stage is a sequential series of tasks, which are executed in the specified order to perform a unit of work in an associated block. A subflow corresponding to a block is a directed acyclic graph (e.g., tree). That is, some tasks are constrained to execute as a sequential series of stages, which are executed in a specified order, while other tasks may be independent of each other.

Although the present embodiment as shown in FIG. 3A illustrates a hierarchical collection of stages comprising three levels, other embodiments of the present invention are well suited to collections of stages with more or less hierarchical levels.

Figure 3B:
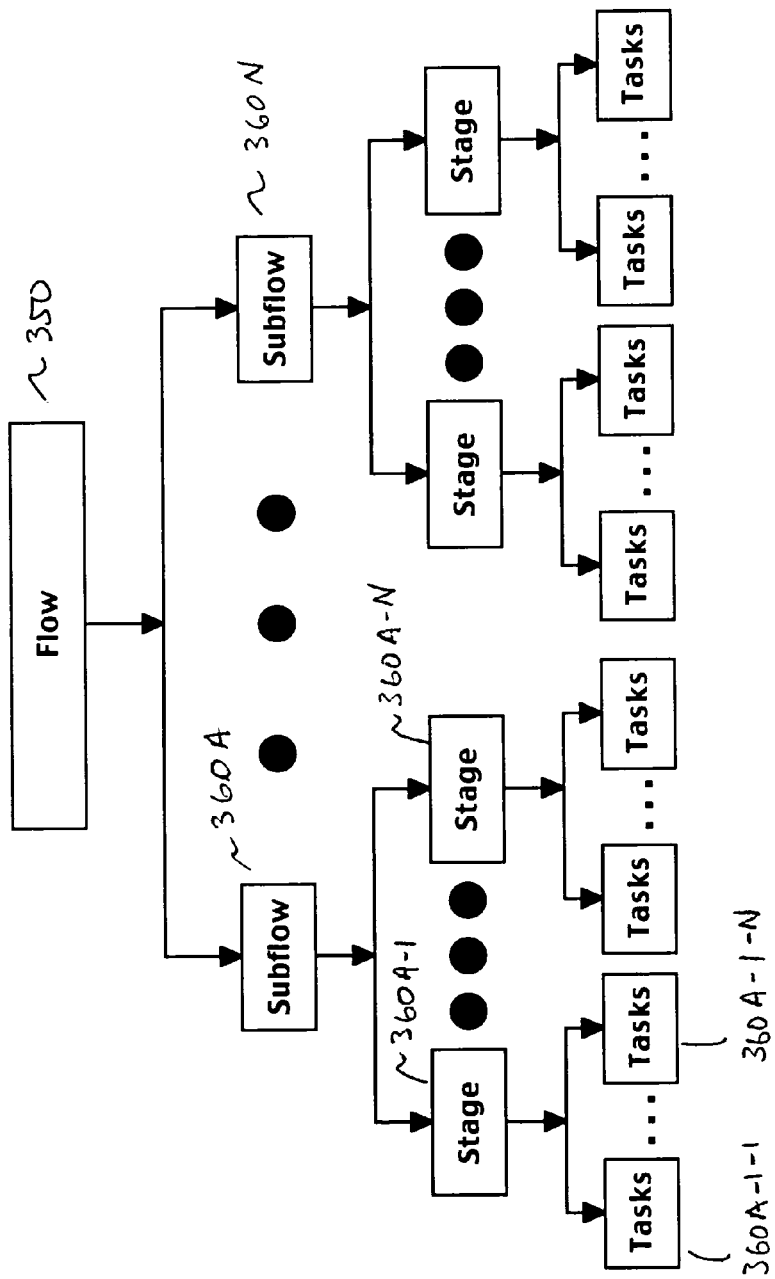
FIG. 3B is a diagram illustrating an implementation flow of a collection of stags used in an instance of a flow definition language for designing integrated circuit implementation flows, in accordance with one embodiment of the present invention.

FIG. 3B is a diagram of an exemplary implementation flow 300B for purposes of illustration only. The implementation flow 300B includes a flow 350 that is associated with a physical design of an IC chip. The implementation flow 300 includes one or more subflows 360A through 360N that stem from the flow. Within the implementation flow 300B, various relational constraints define the execution order of the subflows relative to each other, as well as the execution order of stages and/or tasks both within and between subflows.

As shown in FIG. 3B, the subflows occur at the same level in the hierarchical collection of stages of the implementation flow. However, the execution order of the subflows will vary depending on the relational constraints specified in the instance of the flow definition language used to generate the implementation flow 300B. For instance, subflow 360A may precede subflow 360N, or subflow 360A may be executed independently of subflow 360N, etc.

Figure 3C:
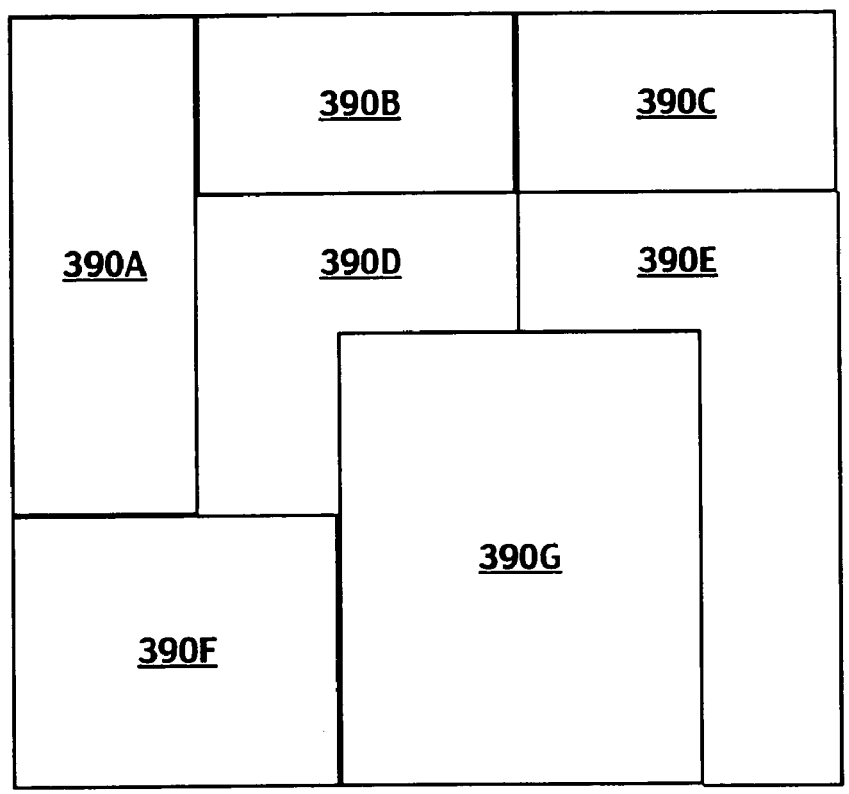
FIG. 3C is a diagram of a plurality of blocks associated with a physical layout of an integrated circuit chip, in accordance with one embodiment of the present invention.

The subflows can correspond to rectilinear blocks of a physical layout or representation of an IC chip. For instance, in FIG. 3C, a plurality of blocks 390A-G of an exemplary hierarchical integrated circuit 300C is shown. Each of the rectilinear blocks (e.g., block 390A) correspond to a subflow in an implementation flow associated with a physical layout of the hierarchical integrated 300C.

Additionally, the implementation flow 300B includes one or more stages 370 that stem from each of the subflows 360. For instance, stages 360A-1 through 360A-N stem from subflow 360A, and stages 360N-1 through 360N-N stem from subflow 360N. The stages represent the physical design operations that can be performed on a block of a physical IC design. Within the implementation flow 300, various relational constraints define the execution order of stages relative to each other, both within a subflow and between subflows of a hierarchical collection of stages 300, as defined in the instance of the flow definition language used to build the implementation flow.

As shown in FIG. 3B, the stages occur at the same level in the hierarchical collection of stages of the implementation flow 300B. However, the execution order of the stages both within a subflow and between subflows will vary depending on the relational constraints specified in the instance of the flow definition language used to generate the implementation flow 300B. For instance, stage 360A-1 may precede stage 360N-N, or stage 360A-1 may be executed independently of stage 360N-N, etc.

In the instance of the flow definition language, the stages form the fundamental building blocks of the implementation flow 300B. Specifically, in the hierarchy 300A of the implementation flow 300B, the stages provide the opportunity at the lowest levels of the hierarchy 300A to define the parameters specific to the implementation flow 300B. That is, the instance of the flow definition language provides for defining parameters, such as relational constraints and parameterized knobs for the implementation flow 300B at the stage level. As such, those parameters defined for a particular stage apply universally throughout that stage.

Stages represent a set of linked physical design processes that are to be executed on the block that corresponds to a subflow. As an example, stages in the implementation flow 300B may include placement, global route, clock tree synthesis, etc.

Each of the stages is comprised of one or more tasks. In one embodiment, the tasks are performed in sequential order to perform a unit of work. In particular, the tasks correspond to certain actions that are performed by physical design tools. For instance, tasks 360A-1-1 through 360A-1-N stem from stage 360A-1.

Each task is a discrete unit of work, which involves executing a software program in an associated physical design point tool. Some of the tasks are constructive in that they result in a more complete implementation flow for a physical layout of an IC chip. Other tasks are analytic in that they derive metrics that are useful in gauging whether the quality of service requirements are being met. The tasks can be arranged in any logical order to create an associated stage.

In the instance of the flow definition language used to build the implementation flow 300B, relational constraints define the execution order of tasks in the hierarchical collection of stages of the implementation flow 300B. That is, the relational constraints both within a stage, between stages, and between subflows are the parameters used to generate the order by which tasks are executed in an implementation flow 300B of a physical layout of an associated IC chip.

Furthermore, parameterized knobs, or parameters, are used to customize each of the plurality of tasks. These parameterized knobs are defined at the stage level, or at higher levels in the hierarchical collection of stages. In general, these tasks are associated with low level program commands for directing a number of physical design tools (e.g., programs) to perform various functions with respect to a stage in a block of the implementation flow.

Figure 4:
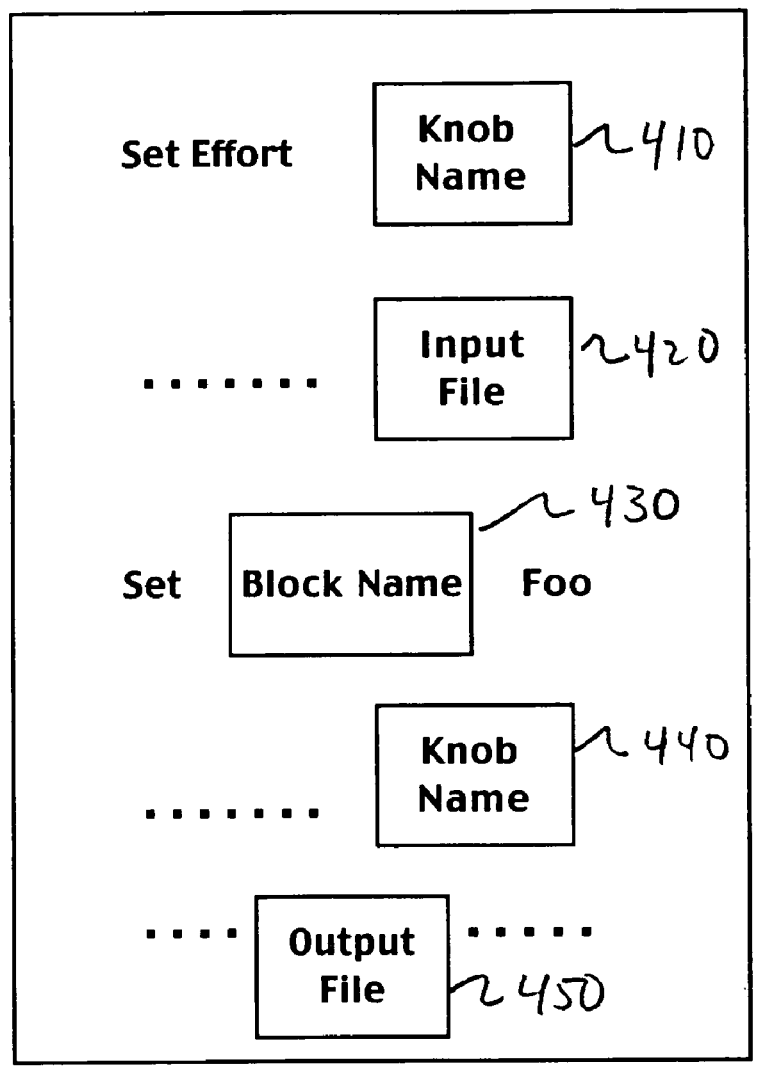
FIG. 4 is a task template that is customized using parameterized knobs, in accordance with one embodiment of the present invention.

FIG. 4 is an illustration of a task template 400 used in the instance of the flow definition language used to build a corresponding implementation flow, in accordance with one embodiment of the present invention. In FIG. 4, an exemplary task is specified as a template. For instance, a task can be written in text form (e.g., command files, shell, script, etc.) to instruct a physical design point tool to perform a certain operation. In the flow definition language, each of the tasks used in the flow definition language is specified by a template.

In one embodiment, each of the tasks is specified by a command-file template. Many physical design computer programs employ the "command file" format, which specifies what steps to execute in the physical design point tool. The instance of the flow definition language can partition out a command file as a series of sections referred to by name. Each section is a template, and the series of sections comprises a complete command file, and is also a template.

The parameterized knobs, or parameters, are variables or selectable descriptions which can be selected in order to tune the execution of the physical design tool. That is, the functions of the physical design tool can be customized by selecting the value of the parameterized knobs used in the command file template or templates. The value for a specified parameterized knob can be specified as a fixed string, the value of some other parameterized knob in some other stage (e.g., the previous stage of the implementation flow), the output of a stage, or any combination of the above.

As shown in FIG. 4, the exemplary task template 400 includes lines of text. Contained within the exemplary task template are parameterized knobs, 410, 420, 430, 440 and 450. As described previously, each of the parameterized knobs can be set to customize the task associated with the task template 400. The knobs can specify any parameter, such as text strings, values, etc. Also, each of the knobs is identified by a knob name.

For instance, knob 410 can be set between various levels of effort (e.g., high, medium, or low) in the instance of the flow definition language. The effort level may define how long, or how much computational effort is used to generate the implementation flow of the stage associated with the exemplary task template 400. Knob 420 can be the input file that receives an input for the task. Also, knob 430 may specify the block name that is associated with the exemplary task template 400. Knob 450 may produce an "output file" of the task template 400.

Each of the knobs 410, 420, 430, 440, and 450 can be defined at the stage level. That is, a stage is comprised of one or more tasks, each of which is associated with one or more parameterized knobs. Additionally, the knobs may occur in one or more of the tasks. Also, the knobs are defined for the entire stage, such that a particular knob will have the same value wherever used within that stage.

In the hierarchy of the collection of stages, the parameterized knobs 410, 420, 430, 440, and 450 can also be defined at higher levels, such as at the subflow level, or at the flow level. Values for parameterized knobs defined at the higher levels override associated values defined at the lower levels.

The use of templates for the tasks allows the tasks to be tailored to associated stages as needed. In this case, variety is achieved in the flow definition language at the task level. For instance, one task template may produce multiple variations of that task depending on the values of the parameterized knobs selected. Also, one task template with set values for the parameterized knobs may be used numerous times throughout the implementation flow, and can be referred to by name at each point in the instance of the flow definition language that builds the implementation flow. This permits the same task to be used for many stages, as well as subflows or blocks in the implementation flow.

Moreover, the stages and subflows can be combined as a template. In this way, this permits the same stage to be used for many different blocks throughout the instance of the flow definition language used to build the implementation flow. Likewise, this permits the same subflow to be used for many different blocks through the implementation flow.

In this manner, stage templates and subflow templates are flexible in their application. For instance, a stage can depend on related stages in arbitrary ways. In one case, stages can be linked together by setting a parameterized knob 420 that is an "input file" to the same value as the parameterized knob that is named an "output file" of a previous stage in the instance of the flow definition language used to build the implementation flow.

Figure 5:
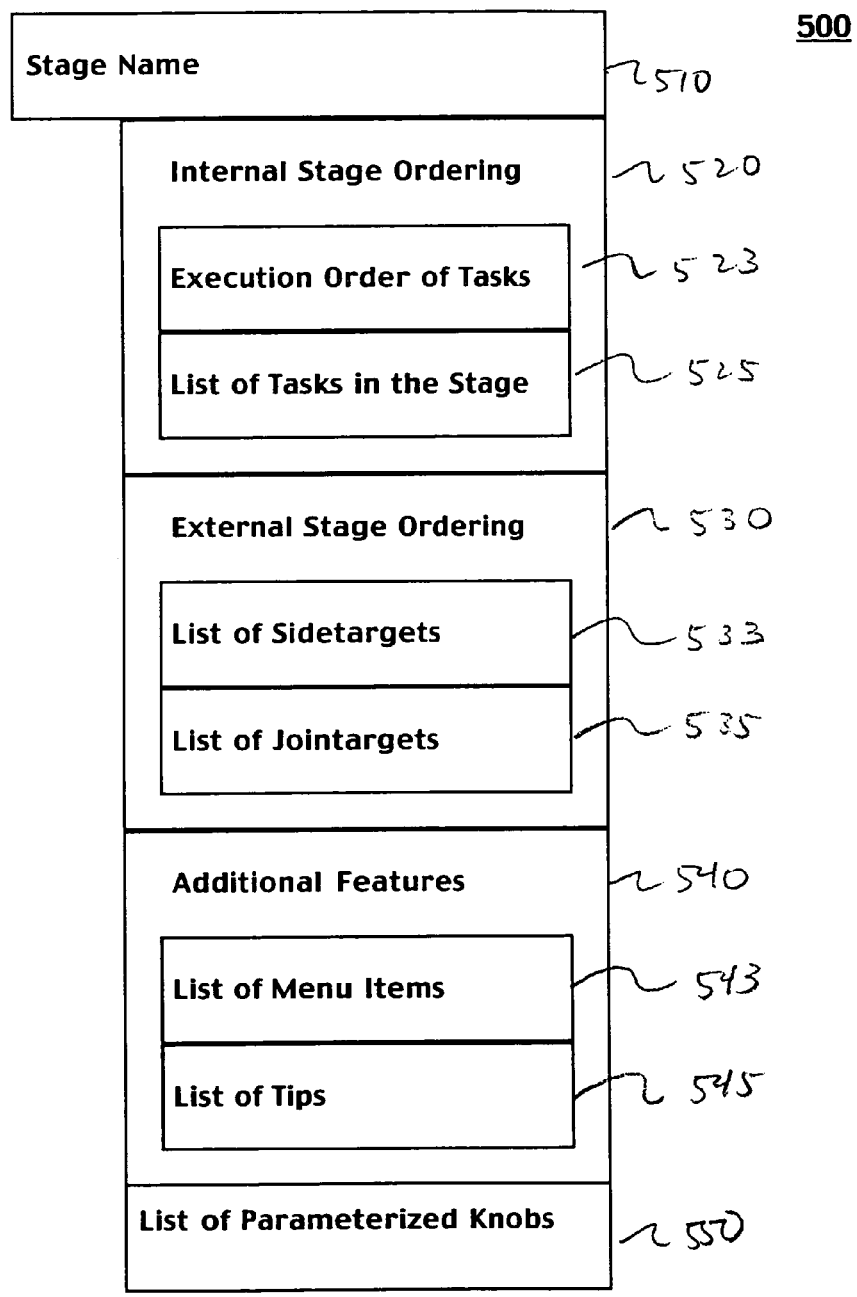
FIG. 5 is a diagram illustrating a stage definition file, in accordance with one embodiment of the present invention.

FIG. 5 is a diagram illustrating an exemplary stage definition file 500 used in an instance of the flow definition language for building an implementation flow. The stage definition file 500 includes various sections, such as stage name 510, internal stage ordering 520, external stage ordering 530, additional features 540 and list of parameterized knobs 550. While the present embodiment describes particular sections, other embodiments are well suited stage definition files with more or less sections, wherein additional sections define additional functions of the corresponding stage.

In one embodiment, the stage definition file 500 is a program template customized through one or more parameterized knobs for executing an operation in a point tool, wherein the program template is written in a format understood by the point tool.

The stage name 510 defines the name of the stage. This identification can be used throughout the instance of the flow definition language used to build the implementation flow that incorporates the stage. For instance, every stage can produce an output (e.g., stage name 510 can produce an output). Other stages can refer to the output of stage name 510 directly, in one embodiment.

The next section, internal stage ordering 520, provides for the execution order 523 of the tasks contained within the stage. For instance, the tasks may be in sequential order, starting with task A, then task B, then task C.

In addition, a list of tasks 525 are provided. For instance, the list of tasks 525 includes all the task templates that are implemented within the stage.

Referring now to FIGS. 6A, 6B, 6C, and 6D, various relational constraints between procedures in the instance of the flow definition language to build an implementation flow are provided. Although the present example is illustrated showing relational constraints between stages, the relational constraints can be applied to determine execution order of tasks, or stages, or subflows.

Figure 6A:
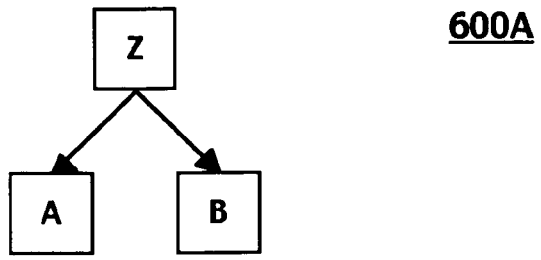
FIG. 6A is a diagram illustrating a lack of relational constraint between stages in an instance of a flow definition language used for designing integrated circuit implementation flows, in accordance with one embodiment of the present invention.

In FIG. 6A, a precedence 600A is illustrated between stage A and stage B in an instance of the flow definition language used for designing integrated circuit implementation flows, in accordance with one embodiment of the present invention. That is, there is a lack of relational constraint between stage A and stage B, such that stage A can be executed independently of stage B. Originally, stage A and stage B may have stemmed from stage Z, but afterwards, there is no precedence in the order of execution order between stage A and stage B.

Figure 6B:
FIG. 6B is a diagram illustrating a precedence relational constraint between stages in an instance of a flow definition language used for designing integrated circuit implementation flows, in accordance with one embodiment of the present invention.

FIG. 6B is a diagram illustrating a precedence relational constraint between stages in an instance of the flow definition language used for designing integrated circuit implementation flows, in accordance with one embodiment of the present invention. That is, stage A must be fully executed before stage B. For instance, the output of stage A is used as an input to stage B.

Figure 6C:
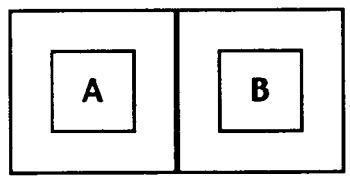
FIG. 6C is a diagram illustrating an exclusive operation relational constraint between stages in an instance of a flow definition language used for designing integrated circuit implementation flows, in accordance with one embodiment of the present invention.

FIG. 6C is a diagram illustrating an exclusive operation relational constraint between stage A and stage B in an instance of the flow definition language used for designing integrated circuit implementation flows, in accordance with one embodiment of the present invention. Specifically, stage A can only execute when stage B is not executing. Likewise, stage B can only execute when stage A is not executing.

Figure 6D:
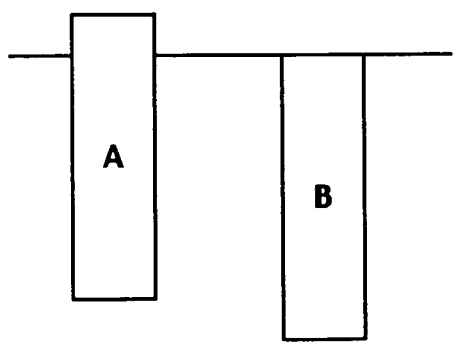
FIG. 6D is a diagram illustrating a weak precedence relational constraint between stages in an instance of a flow definition language used for designing integrated circuit implementation flows, in accordance with one embodiment of the present invention.

FIG. 6D is a diagram illustrating a weak precedence relational constraint between stages in an instance of the flow definition language used for designing integrated circuit implementation flows, in accordance with one embodiment of the present invention. Specifically, the execution of stage A must precede stage B; however, once the execution of stage A starts, stage B may start executing, although stage A may not have fully performed its execution.

Another section, external stage ordering 530, provides for the execution order between stages in an instance of the flow definition language used to build an implementation flow. For instance, the next block provides a list of side targets 533. The list of side targets provides a number of stages that follow the stage associated with stage name 510. The next block provides a list of join targets 535, which provides a number of stages that precede the stages associated with stage name 510.

Figure 7:
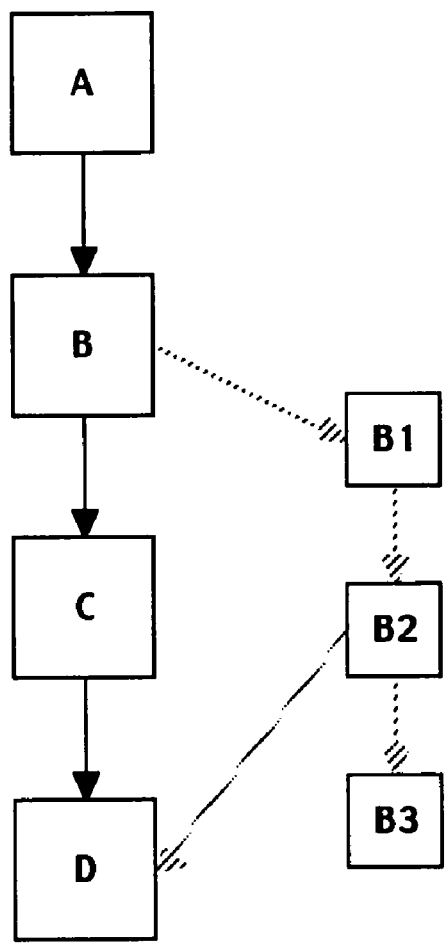
FIG. 7 is a diagram of a subflow illustrating side targets and join targets in an instance of a flow definition language used for designing integrated circuit implementation flows, in accordance with one embodiment of the present invention.

FIG. 7 is a diagram of an exemplary subflow 700 that illustrates side targets and join targets for a particular stage D. For instance, the subflow 700 outlines a sequential series of stages to be performed. That is, in the subflow 700, stage A is completed first, then stage B, then stage C, and then stage D. The subflow 700 is for purposes of illustration only, and it is to be understood that subflows can include any configuration of stages, with any configuration of side targets and join targets.

In FIG. 7, stage B has side targets including stage B1, stage B2, and stage B3. The order of execution of the side targets is such that stage B1 is completed first, then stage B2, then stage B3. While FIG. 7 shows that the side targets are from the same subflow as stage B, it is understood that the side targets can be from one or more subflows. Also, side targets can stem from any stage, including those stages that are included in a list of side targets.

In the flow definition language, any stage can produce an output, or result. In one embodiment, the result is published or listed in the parent subflow, or any intermediate parent stage. For instance, stage B has sidetarget stage B1, where stage B is the parent of stage B1.

In addition, FIG. 7 also illustrates an exemplary join target B2. That is, join target, stage B2, must precede the stage D. As such, stage B2 is a join target of stage D.

Also, in one embodiment, any stage can consume a result or output from any other stage. As a result, if the consuming stage (e.g., stage D of FIG. 7) obtains the output or result (e.g., output of stage B2) to use as a value, or part of a value of a parameterized knob used in stage D. As such, the stage that produced the result or output (stage B2) must precede the consuming stage (stage D), and as such, stage B2 is added to the list of join targets for stage D. For instance, if the value produced and consumed corresponds to a file or other artifact of the system, this ensures that the artifact will be produced before the consuming task in a consuming stage attempts to use it.

Figure 8:
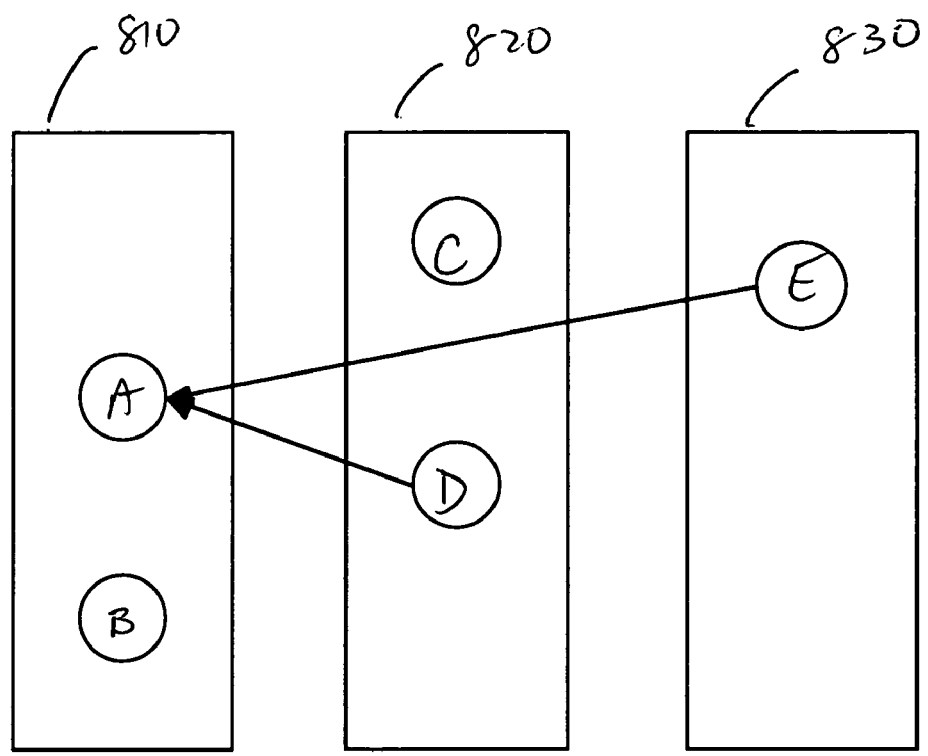
FIG. 8 is a diagram of a plurality of subflows in a flow configuration in an instance of a flow definition language used for designing integrated circuit implementation flows, in accordance with one embodiment of the present invention.

FIG. 8 is a diagram illustrating a plurality of subflows stemming from one flow in an implementation flow of a physical layout, in accordance with one embodiment of the present invention. As shown in FIG. 8, the flow includes subflows 810, 820, and 830. Arbitrary tasks are also shown, such as, task A and task B from subflow 810, task C and task D from subflow 820, and task E from subflow 830. As shown in FIG. 8, the subflows are parallel in their implementation, however, stages within the subflows may depend on each other. For instance, stage A of subflow 810 depends on an output from stage E of subflow 830 and on an output from stage D of subflow 820. In that case, the stage A of subflow 810 must follow both stage D and E, and stages D and E are join targets of stage A. As such, parts of subflow 810 must follow parts of subflow 820 and 830. In other embodiments, entire subflows may depend on other subflows.

Returning back to FIG. 5, the additional features section 540 contains ancillary information useful to the instance of the flow definition language in building the implementation flow, in accordance with one embodiment of the present invention. For instance, a list of menu items 543 is presented that describes a menu for a graphical user interface (GUI) implementing the flow definition language of the present embodiment. Also, a list of tips 545 is presented to describes tool tips in using the GUI. Other information can also be included within the additional features section 540 including documentation of various types, data to be used by the series of programs, description of input requirements, descriptions of output requirements, etc.

In the next block a list of parameterized knobs 550 is included within the stage definition file 500. That is, the parameterized knobs 550 are defined at the stage level, such that a parameterized knob has the same universal value throughout the stage.

In one embodiment, the list of parameterized knobs 550 also includes default values for each parameterized knob that is defined in the stage definition file 500. In one embodiment, not all parameterized values need a default value.

In addition, the list of parameterized knobs 550 also include values that override or substitute the default values for corresponding parameterized knobs. In addition, in the hierarchy of the collection of stages that comprise the implementation flow as implemented through the instance of the flow definition language, higher order definitions override lower order definitions of parameterized knobs. For instance, if a parameterized knob is defined at both the subflow level as well as at a stage level, then the definition at the subflow level overrides the definition at the stage level. That is, a subflow can define default values for any parameterized knob in any of its stages. The subflow does not have to specify values for every parameterized knob. As such, any values that are specified at the subflow level override the values specified at the stage level. Similarly, the flow level can specify values for parameterized knobs in any of its subflows. It also does not have to specify valued for every parameterized knob. And, any values that are specified at the flow level override the values specified at the subflow and stage levels.

As a result, each stage is created by instantiating a "stage template" in the instance of the flow definition language. The stage template is a parameterized description of the stage. Each parameter (e.g., parameterized knob) has a name, and may include documentation, default values, and a type. The flow definition language allows an arbitrary value or values to be supplied for each parameterized knob. These values override default values for corresponding parameterized knobs. Also, in the hierarchy of the implementation flow, higher order definitions of the parameterized knobs override lower level definitions of the parameterized knobs.

In addition, templates can be formed at the subflow and flow levels in the instance of the flow definition language. These templates can be of the form shown in exemplary FIG. 5. In addition, other templates can be formed for the join targets and side targets. In this way, templates can be filled out in an extremely flexible fashion, automatically by an execution engine generating the implementation flow. Each of the templates can depend on related templates in arbitrary fashion. That is subflows, stages, join targets, side targets, and tasks can be tailored in the same fashion and can depend upon each other depending on the relational constraint. For instance a set of join targets can depend upon which block it is operating on.

In one embodiment, the syntax of the instance of the flow definition language is an object oriented syntax of extensible markup language (XML). The flow definition language also specifies a collection of targets (e.g., stages). These targets can be requested, such that the implementation flow can be generated up to that target. Fulfilling the request may entail executing one or more tasks in some order following relational constraints.

Also, the instance of the flow definition language in the form to generate an implementation flow can be compiled into a more efficient internal form by an execution engine. The execution engine accepts one or more requests, and carries out the requested activity. That is the implementation flow is generated up to the target request (e.g., stage) following the constraints and parameterized values defined in the instance of the flow definition language. Requests may arrive at arbitrary times in the design of the implementation flow, and in arbitrary order. The execution engine caries out the requests in a way that satisfies the constraints expressed throughout the instance flow definition language. Specifically, the execution engine is able to compile the flow definition language into an internal form in which all parameterized knobs are filled in and all join targets and side targets are explicitly represented. Also, the ordering of tasks is enforced by the execution engine in compliance with the relational constraints of the instance of the flow definition language. The method of enforcement is not dependent on file modification times or other timing information derived from system clocks. Thus, embodiments of the present invention are immune from problems, such as clock skew between computers. Also, the execution checks to ensure that the ordering of tasks is acyclic.

Figure 9:
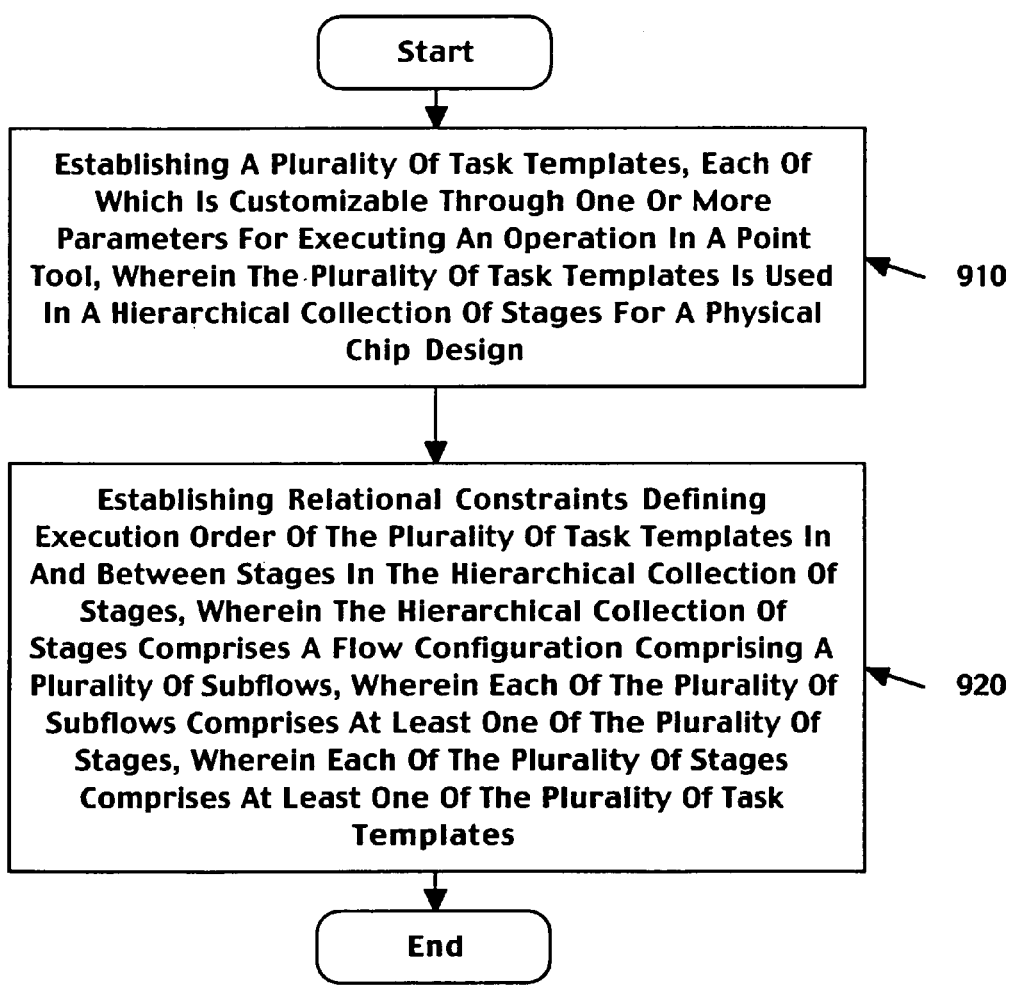
FIG. 9 is a flow chart of a method for designing an instance of a flow definition language used for designing integrated circuit implementation flows, in accordance with one embodiment of the present invention.

Referring now to FIG. 9, a flow chart 900 is disclosed illustrating steps in a method for designing an implementation flow of a physical design layout, in accordance with one embodiment of the present invention. That is, an instance of a flow definition language is used to build the implementation flow.

At 910, the present embodiment establishes a plurality of task templates. Each of the task templates is customizable through one or more parameterized knobs for executing an operation in an associated point tool. The plurality of task templates is used in a hierarchical collection of stages as implemented in an instance of a flow definition language to build the implementation flow for a physical chip design.

At 920, the present embodiment establishes relational constraints defining execution order of the plurality of task templates within associated stages, as implemented through the instance of the flow definition language. Further, the present embodiment provides an execution order between stages in the hierarchical collection of stages of the instance of the flow definition language. That is, the hierarchical collection of stages comprises a flow configuration that includes one or more subflows, and wherein each of the subflows comprises one or more stages, and wherein each of the plurality of stages comprises one or more task templates.

The present embodiment further comprises at a stage, providing for the internal ordering of tasks templates in that stage. That is, the order of execution for that stage is defined. Also, the relational constraint for the eternal ordering of stages in relation to that stage is provided in the instance of the flow definition language used to build the implementation flow.

In addition, the present embodiment provides for establishing default values for parameterized knobs used in that stage, and for providing the substitution of those default values when indicated.

Also, the present embodiment allows for the automatic generation of the implementation flow up to a specified target (e.g., stage). Specifically, the present embodiment is able to generate the implementation flow by following the relational constrains and parameterized knobs defined in the instance of the flow definition language used to build the implementation flow.

Also, the present embodiment hierarchically orders relational constraints defining execution order of the stages in the hierarchical collection of stages and parameterized knobs. That is, higher order definitions in the hierarchical collection of stages override lower order definitions of relational constraints and parameterized knobs. In one embodiment, the hierarchy of the collection of stages includes a flow at the top level, a subflow at the next highest level, and stage level at the next highest level.

In addition, the present embodiment links stages in a hierarchical collection of stages by listing all stages that precede a stage in a join target of that stage in an instance of the flow definition language used to build the associated implementation flow.

Also, the present embodiment links stages in a hierarchical collection of stages by listing all stages that follow a stage in a side target of that stage in an instance of the flow definition language used to build the associated implementation flow.

Further, in another embodiment, stages can be linked by output names. That is a particular output is specified in an instance of the flow definition language used to build an implementation flow of a physical layout. The output may be generated by any stage within the implementation flow. As such, linking of stages can be provided through the "output name." For instance, a first stage names its output a particular name. A second stage may refer to the output by name only. That is, the second stage in the instance of the flow definition language does not know the stage name that generates the output, however, the second stage can refer to that output by the "output name."

While the methods of embodiments illustrated in flow chart 900 show specific sequences and quantity of steps, the present invention is suitable to alternative embodiments. For example, not all the steps provided for in the method are required for the present invention. Furthermore, additional steps can be added to the steps presented in the present embodiment. Likewise, the sequences of steps can be modified depending upon the application.

Embodiments of the present invention, a flow definition language and a method for implementing the same for generating an implementation flow of a physical layout of an IC chip has been described. While the invention is described in conjunction with the preferred embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

What is claimed:

1. A method for generating a hierarchical flow definition language for designing integrated circuit implementation flows, the method comprising:
   generating a plurality of command file templates defining tasks associated with a physical chip design, each of which are customized through one or more parameters;
   generating a plurality of stage definition files defining relational constraints of execution order of tasks in associated stages of said physical chip design, execution order between stages of said physical chip design, and values for parameters used within a corresponding stage, wherein each of said plurality of stage definition files is comprised of at least one of said plurality of command file templates; and
   generating a plurality of subflow definition files defining relational constraints between stages and subflows in said physical chip design, wherein each said plurality of subflow definition files is comprised of at least one of said plurality of stage definition files.

2. The method of claim 1, further comprising:
   generating a flow definition file for defining relational constraints between stages and subflows in said physical chip design, and comprising at least one of said plurality of subflow definition files.

3. The method of claim 2, wherein each of said plurality of stage definition files comprises:
   an internal ordering of the execution of tasks in that stage;
   an external ordering of the execution of stages in relation to that stage;
   default values for parameters used in that stage; and
   values substituting corresponding parameters.

4. The method of claim 3, wherein relational constraints and parameter values are hierarchically defined, such that higher order definitions override lower level definitions of said relational constraints and parameter values.

5. The method of claim 4, wherein an order of a top down hierarchy of said physical chip design comprises: said flow definition file; said plurality of subflow definition files; and said plurality of stage definition files.

6. The method of claim 1, wherein each of said plurality of command file templates executes a task of a point tool.

7. The method of claim 1, further comprising:
   receiving a join target template defined at a first stage for identifying a collection of stages that precede said first stage in execution of said physical chip design.

8. The method of claim 1, further comprising:
   receiving a side target template defined at a first stage for identifying a collection of stages that follow said first stage in execution of said physical chip design.

9. A hierarchical flow definition language data structure embodied in a computer-readable medium, the hierarchical flow definition language data structure being arranged to allow an application executed by a processor of a computer system to generate integrated circuit implementation flows, the computer-readable medium comprising:
   a plurality of command file templates defining tasks associated with a physical chip design, each of which are customized through one or more parameters;
   a plurality of stage definition files defining relational constraints of execution order of tasks in associated stages of said physical chip design, execution order between stages of said physical chip design, and values for parameters used within a corresponding stage, wherein each of said plurality of stage definition files is comprised of at least one of said plurality of command file templates; and a plurality of subflow definition files defining relational constraints between stages and subflows in said physical chip design, wherein each said plurality of subflow definition files is comprised of at least one of said plurality of stage definition files.

10. The computer-readable medium of claim 9, further comprising:

a flow definition file for defining relational constraints between stages and subflows in said physical chip design, and comprising at least one of said plurality of subflow definition files.

11. The computer-readable medium of claim 10, wherein each of said plurality of stage definition files comprises:

an internal ordering of the execution of tasks in that stage;

an external ordering of the execution of stages in relation to that stage;

default values for parameters used in that stage; and values substituting corresponding parameters.

12. The computer-readable medium of claim 11, wherein relational constraints and parameter values are hierarchically defined, such that higher order definitions override lower level definitions of said relational constraints and parameter values.

13. The computer-readable medium of claim 12, wherein an order of a top down hierarchy of said physical chip design comprises: said flow definition file; said plurality of subflow definition files; and said plurality of stage definition files.

14. The computer-readable medium of claim 10, wherein each of said plurality of command file templates executes a task of a point tool.

15. The computer-readable medium of claim 10, further comprising:

code for receiving a join target template defined at a first stage for identifying a collection of stages that precede said first stage in execution of said physical chip design.

16. The computer-readable medium of claim 10, further comprising:

code for receiving a side target template defined at a first stage for identifying a collection of stages that follow said first stage in execution of said physical chip design.

17. A data processing system comprising:

a processor; and a memory coupled to the processor, the memory configured to store a set of data structures arranged to allow an application executed by the processor to generate integrated circuit implementation flows, the memory comprising:

a plurality of command file templates defining tasks associated with a physical chip design, each of which are customized through one or more parameters;

a plurality of stage definition files defining relational constraints of execution order of tasks in associated stages of said physical chip design, execution order between stages of said physical chip design, and values for parameters used within a corresponding stage, wherein each of said plurality of stage definition files is comprised of at least one of said plurality of command file templates; and a plurality of subflow definition files defining relational constraints between stages and subflows in said physical chip design, wherein each said plurality of subflow definition files is comprised of at least one of said plurality of stage definition files.

18. The system of claim 17, further comprising:

a flow definition file for defining relational constraints between stages and subflows in said physical chip design, and comprising at least one of said plurality of subflow definition files.

19. The system of claim 18, wherein each of said plurality of stage definition files comprises:

an internal ordering of the execution of tasks in that stage;

an external ordering of the execution of stages in relation to that stage;

default values for parameters used in that stage; and values substituting corresponding parameters.

20. The system of claim 19, wherein relational constraints and parameter values are hierarchically defined, such that higher order definitions override lower level definitions of said relational constraints and parameter values.

21. The system of claim 20, wherein an order of a top down hierarchy of said physical chip design comprises: said flow definition file; said plurality of subflow definition files; and said plurality of stage definition files.

22. The system of claim 17, wherein each of said plurality of command file templates executes a task of a point tool.

23. The system of claim 17, further comprising:

receiving a join target template defined at a first stage for identifying a collection of stages that precede said first stage in execution of said physical chip design.

24. The system of claim 17, further comprising:

receiving a side target template defined at a first stage for identifying a collection of stages that follow said first stage in execution of said physical chip design.

* * * * *